United States Patent
Pan et al.

(10) Patent No.: US 9,919,913 B2
(45) Date of Patent: Mar. 20, 2018

(54) FULLY DEPLETED REGION FOR REDUCED PARASITIC CAPACITANCE BETWEEN A POLY-SILICON LAYER AND A SUBSTRATE REGION

(71) Applicant: Cirrus Logic, Inc., Austin, TX (US)

(72) Inventors: Shanjen Pan, Austin, TX (US); Marc L. Tarabbia, Austin, TX (US)

(73) Assignee: CIRRUS LOGIC, INC., Austin, TX (US)

(*) Notice: Subject to any disclaimer, the term of this patent is extended or adjusted under 35 U.S.C. 154(b) by 0 days.

(21) Appl. No.: 14/942,824

(22) Filed: Nov. 16, 2015

(65) Prior Publication Data
US 2016/0145093 A1   May 26, 2016

Related U.S. Application Data

(60) Provisional application No. 62/082,324, filed on Nov. 20, 2014.

(51) Int. Cl.
*B81C 1/00* (2006.01)
*H04R 19/04* (2006.01)
(Continued)

(52) U.S. Cl.
CPC ........ *B81B 3/0086* (2013.01); *B81C 1/00698* (2013.01); *H04R 19/005* (2013.01);
(Continued)

(58) Field of Classification Search
CPC .......... B81B 3/0086; B81B 2201/0257; B81C 1/00698; H04R 23/00; H04R 2201/003; H04R 2307/025; H01L 27/0623–27/0635; H01L 27/0647; H01L 27/0652; H01L 27/0664–27/0676; H01L 27/0711–27/0727; H01L 27/075–27/0766; H01L 27/0783;
(Continued)

(56) References Cited

U.S. PATENT DOCUMENTS

| | | | |
|---|---|---|---|
| 8,878,334 B1* | 11/2014 | Ratnakumar | H01L 27/0738 257/528 |
| 2008/0042241 A1* | 2/2008 | Chiang | H01L 29/66166 257/536 |
| 2012/0104519 A1 | 5/2012 | Watanabe et al. | |

FOREIGN PATENT DOCUMENTS

KR   20130044761 A   5/2013

* cited by examiner

*Primary Examiner* — Daniel Luke
*Assistant Examiner* — Khatib Rahman
(74) *Attorney, Agent, or Firm* — Norton Rose Fulbright US LLP

(57) ABSTRACT

A fully depleted region may be used to reduce poly-to-substrate parasitic capacitance in an electronic device with poly-silicon layer. When the fully depleted region is located at least partially beneath the electronic device, an additional parasitic capacitance is formed between the fully depleted region and the substrate region. This additional parasitic capacitance is coupled in series with a first parasitic capacitance between a poly-silicon layer of the electronic device and the doped region. The series combination of the first parasitic capacitance and the additional parasitic capacitance results in an overall reduction of parasitic capacitance experience by an electronic device. The structure may include two doped regions on sides of the electronic device to form a fully depleted region based on lateral interaction of dopant in the doped regions and the substrate region.

18 Claims, 7 Drawing Sheets

(51) Int. Cl.
 *B81B 3/00* (2006.01)
 *H04R 19/00* (2006.01)
(52) U.S. Cl.
 CPC ...... *B81B 2201/0257* (2013.01); *H04R 19/04* (2013.01); *H04R 2307/025* (2013.01)
(58) Field of Classification Search
 CPC ...... H01L 27/0266; H01L 28/20–28/26; H01L 27/0802; H01L 27/101; H01L 29/66166; H01L 29/8605; H01L 43/08; H01L 2924/1207; H01L 27/0788–27/0794; H01L 29/7408; H01L 51/05; H01L 2027/11842
 See application file for complete search history.

FULLY DEPLETED REGION FOR REDUCED PARASITIC CAPACITANCE BETWEEN A POLY-SILICON LAYER AND A SUBSTRATE REGION

CROSS-REFERENCE TO RELATED APPLICATIONS

This application claims the benefit of priority of U.S. Provisional Patent Application No. 62/082,324 to Pan et al. filed on Nov. 20, 2014 and entitled "Method of Reducing Parasitic Poly-to-Substrate Capacitance and Respective Apparatuses and Devices," which is hereby incorporated by reference in its entirety.

FIELD OF THE DISCLOSURE

The instant disclosure relates to semiconductor devices. More specifically, portions of this disclosure relate to reducing parasitic capacitance between semiconductor devices and substrates on which the devices are built.

BACKGROUND

Semiconductor manufacturing processes involve the formation and deposition of various layers. Two layers that exist in semiconductor substrate devices are a poly-silicon layer and a substrate layer. Parasitic capacitance exists between such layers, and it is particularly important to control the parasitic capacitance that exists between the poly-silicon layer and layers beneath the poly-silicon layer, including the substrate. In particular for the substrate, conventional poly-to-substrate capacitance can be high, especially for high impedance poly-silicon devices (or "poly-devices"). The poly-silicon layer can be used to form a poly-resistor or a poly-diode.

FIG. 1 shows an example cross section of a semiconductor substrate with a poly-silicon device according to the prior art. A system 100 includes a p-doped substrate 102 with an N-well ("NW") doped region 104 under a shallow trench isolation ("STI") dielectric layer 108. A poly-silicon layer (not shown), such as in device 110, on the STI layer 108 can have a capacitance to the N-well doped region 104 represented by capacitance 120. The capacitance 120 can be about 0.1 fF per micron squared when the STI layer 108 has a depth of 0.3 to 0.4 microns. Also shown in FIG. 1 are P-well (PWELL) doped regions 106A and 106B.

One conventional technique for reducing the poly-to-substrate capacitance 120 is to increase the thickness of the STI layer 108. However, increasing the thickness of the STI layer 108 limits the density of devices 110 and also increases cost of the end products.

Shortcomings mentioned here are only representative and are included simply to highlight that a need exists for improved electrical components, particularly for poly-silicon devices employed in consumer-level devices, such as mobile phones. Embodiments described herein address certain shortcomings but not necessarily each and every one described here or known in the art.

SUMMARY

A fully depleted region may be used to reduce the poly-to-substrate parasitic capacitance. When the fully depleted region is located at least partially beneath the electronic device, an additional parasitic capacitance is formed between the fully depleted region and the substrate region. This additional parasitic capacitance is coupled in series with a first parasitic capacitance between the electronic device and the doped region. When structures are selected such that the additional parasitic capacitance is approximately equal to the first parasitic resistance, the series combination of the first parasitic capacitance and the additional parasitic capacitance results in an overall reduction of parasitic capacitance experience by an electronic device. Although the largest reduction is obtained for equal capacitances between the first and additional capacitances, a reduction in the parasitic capacitance can be obtained for other values of the additional capacitance. The additional parasitic capacitance value is determined by structural sizes and dopant levels, among other factors, each of which may be selected, in part, based on a desired additional parasitic capacitance value. Selection of the structures may include, for example, positioning two doped regions on sides of the electronic device to form a fully depleted region based on lateral interaction of dopant in the doped regions and the substrate region. This reduced parasitic capacitance is particularly advantageous for high impedance poly-silicon-based devices and microelectromechanical system (MEMS) microphones.

According to one embodiment, an apparatus may include a substrate region having a first doping; a dielectric layer on the substrate region; a doped region in the substrate region, wherein the doped region has a second doping that is an oppositely polarity dopant from the first doping of the substrate region; a depletion region in the substrate region formed by lateral interaction between the second doping of the doped region and the first doping of the substrate region; and/or an electronic device on the dielectric layer and at least partially over the depletion region such that a parasitic capacitance between the electronic device and the substrate region is reduced.

In certain embodiments, the doped region may be located on one side of the electronic device, the doped region may include a first doped region and a second doped region; the first doped region and the second doped regions may be on opposite sides of the electronic device; the first doped region and the second doped region may include wells; the second doping may be n-doped; the first doping may be p-doped; the first doped region and the second doped region may be spaced a distance apart that creates a continuous depletion region in the substrate between the first doped region and the second doped region; the doped region may be an annular shape; the depletion region may include a portion of a region defined within an annulus; the electronic device may be a microelectromechanical system (MEMS) microphone; the depletion region may be configured to reduce capacitance between the MEMS microphone and a ground; and/or the parasitic capacitance may be reduced by at least twenty percent compared to a similar electronic device with no depletion region below the similar electronic device.

In certain embodiments, a power supply may be coupled to the doped region and configured to bias the doped region.

According to another embodiment, a method may include depositing an implant blocking layer over a substrate region having a first doping; patterning the implant blocking layer to form openings defining doped regions of the substrate; implanting dopant through the openings in the implant blocking layer to form doped regions in the substrate region, wherein the dopant is of a second doping is an opposite polarity from that of the first doping, and wherein the step of implanting the dopant forms a depletion region in at least a portion of the substrate region by lateral interaction between dopant of the second doping in the doped regions and dopant of the first doping in the substrate region; and/or forming an electronic device at least partially over the depletion region such that a parasitic capacitance between the electronic device and the substrate region is reduced.

In certain embodiments, the step of patterning the implant blocking layer may include forming at least one opening to form a doped region on a side of the electronic device; the step of patterning the implant blocking layer may include forming a first opening for a first doped region and a second opening for a second doped region; the first doped region and the second doped regions may be on opposite sides of the electronic device; the first doped region and the second doped region may be spaced a distance apart that creates a continuous depletion region in the substrate region between the first doped region and the second doped region; the step of patterning the implant blocking layer may include forming an annular opening; the depletion region may include a portion of a region defined within the annulus; the step of forming the electronic device may include forming a poly-silicon based device; the step of forming the poly-silicon based device may include a microelectromechanical system (MEMS) microphone; the step of implanting the dopant may include implanting an n-type dopant in a p-type doped substrate region; and/or depositing the implant blocking layer may include depositing a sacrificial layer.

According to another embodiment, a microelectromechanical system (MEMS) microphone system may include a substrate region having a first doping; a dielectric layer on the substrate region; a doped region in the substrate region, wherein the doped region has a second doping that has an oppositely polarity from that of the first doping of the substrate region; a depletion region in the substrate region formed by lateral interaction between the second doping of the doped region and the first doping of the substrate region; and/or a polysilicon-based diaphragm on the dielectric layer and at least partially over the depletion region such that a parasitic capacitance between the polysilicon-based diaphragm and the substrate region is reduced.

In certain embodiments, the MEMS microphone system may also include a power supply coupled to the doped region and configured to bias the doped region; and/or the parasitic capacitance is reduced by at least twenty percent compared to a similar electronic device with no depletion region below the similar electronic device.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
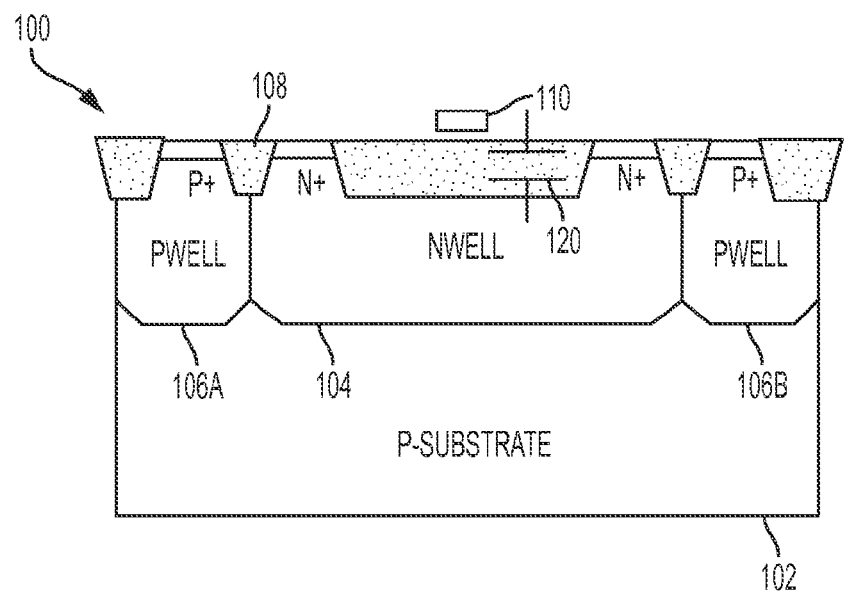
FIG. 1 shows an example cross-section of a semiconductor substrate with a poly-silicon device according to the prior art.

A fully depleted region may be used to reduce the poly-to-substrate parasitic capacitance. The fully depleted region may be formed through a very low doping area near one or more higher doped regions, in contrast to doping the area to form a continuous n-well under an electronic device as shown in prior art FIG. 1. The amount of doping to form the fully depleted region may depend on a p-substrate doping level and an n-well doping level. The fully depleted region may be a built-in depletion zone, in that it does not require an additional mask to be added to the fabrication process. For example, the fully depleted region may be formed between two n-wells formed as part of the manufacturing process by placing the two n-wells at an appropriate distance apart from each other. The depth of the fully depleted region may be around or equal to 1 micron. With a depth of about 1 micron, the parasitic capacitance between the poly-layer (e.g., poly-resistor or poly-diode) and the substrate layer can be reduced to one third or less than the parasitic capacitance that exists in a semiconductor substrate that has an entire n-well doped region underneath the STI structure.

The parasitic capacitance is reduced because the fully depleted region provides an additional capacitance C2 (between the fully depleted region and the substrate) that is in series with the parasitic capacitance C1 (between the poly-layer and the fully depleted region). Placement of these capacitances in series provides a lower capacitance amount compared with just the parasitic capacitance C1. That is, the capacitance of the series capacitances C1 and C2 may be calculated as $$C_{series} = \frac{C1 \times C2}{C1 + C2},$$

where for the appropriate values of capacitances C1 and C2, capacitance $C_{series}$ is less than capacitance C1. The fully depleted region may thus be designed in a way that provides a desired amount of capacitance C2 that will be added to reduce the overall parasitic capacitance $C_{series}$. This $C_{series}$ value will be lower than the capacitance in the conventional structure of FIG. 1.

Figure 2:
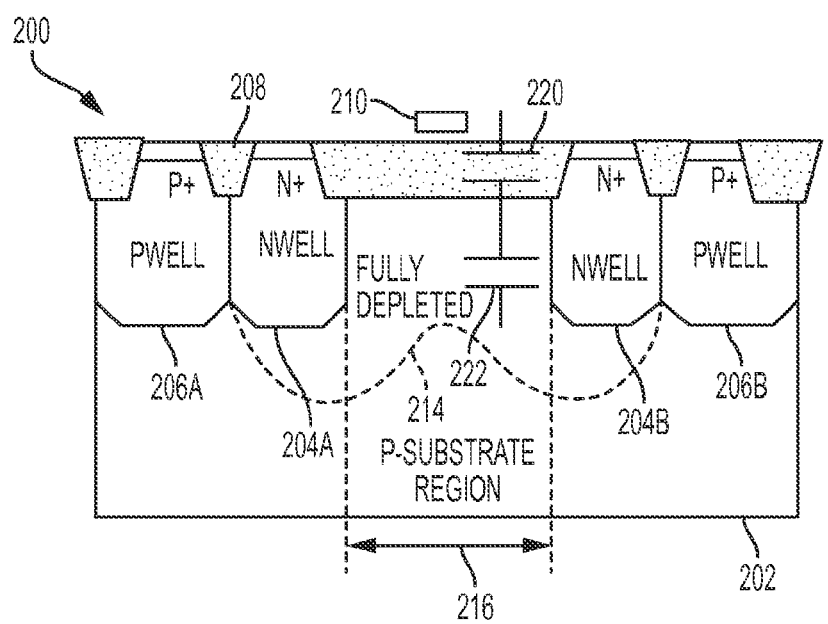
FIG. 2 shows an example cross-section of a semiconductor substrate with a poly-silicon device over a depleted region according to one embodiment of the disclosure.

FIG. 2 shows an example cross-section of a semiconductor substrate with a poly-silicon device over a depleted region according to one embodiment of the disclosure. A system 200 may include a substrate region 202 over which a poly-silicon device 210 may be constructed. The substrate region 202 may have a first polarity of doping, such as p-type doping, and have a dopant level of approximately $5 \times 10^{14}$–$1 \times 10^{16}$, although any dopant level may be suitable. In the substrate region 202, doped regions 206A and 206B may be formed having a higher concentration of doping but the same polarity as the first doping of the substrate region 202. The example of FIG. 2 illustrates p$^+$-Pwell doped regions 206A and 206B in a p-doped substrate region 202. Also in the substrate region 202, doped regions 204A and 204B may be formed having an opposite polarity of doping from the first doping of the substrate region 202, and have a dopant level of approximately $5 \times 10^{16}$–$5 \times 10^{17}$, although any dopant level may be suitable. A power supply may be coupled to the doped regions 204A and 204B and configured to bias the doped regions 204A and 204B. The example of FIG. 2 illustrates n$^+$-Nwell doped regions 204A and 204B in a p-doped substrate region 202. The doped regions 204A and 204B may be separated by a spacing 216.

Lateral interaction of dopant in the n$^+$-Nwell doped regions 204A and 204B with dopant in the p-doped substrate region 202 forms a fully depleted region 214. The fully depleted region 214 divides a capacitance between a poly-silicon layer in device 210 and the substrate region 202 into two portions: a first parasitic capacitance 220 between the poly-silicon layer and the fully depleted region 214 through a dielectric layer 208, and a second parasitic capacitance 222 between the substrate region 202 and the fully depleted region 214.

The substrate region 202 may be a portion of a substrate or a deposited layer. For example, the substrate region 202 may be a p-doped silicon substrate, or other semiconductor substrate. The substrate region 202 may also be a semiconductor layer deposited on an insulator, such as with a silicon-on-insulator (SOI) substrate. In a further example, the substrate region 202 may be a portion of a well formed in a semiconductor substrate, such as a large p-well formed on a surface of a silicon substrate in which the p$^+$-Pwells and other features shown in FIG. 2 are formed. In yet a further example, the substrate region 202 may be a portion of a heavily doped p$^+$-substrate that is lightly n-doped to form a lighter p-doped substrate region.

Figure 3:
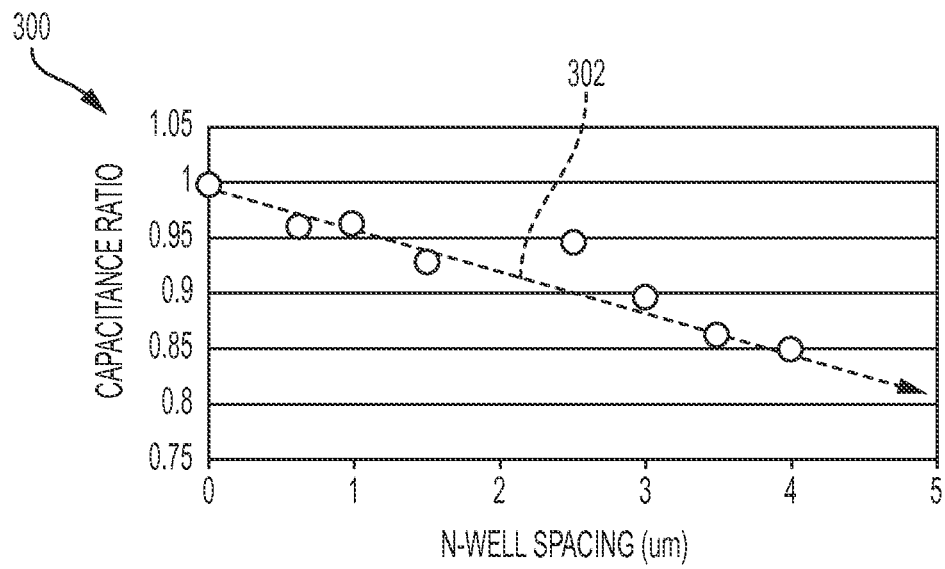
FIG. 3 is an example graph illustrating a capacitance ratio for an example electronic device as a function of n-well spacing according to one embodiment of the disclosure.

The spacing 216 between the doped regions 204A and 204B may affect the parasitic capacitance 222 added in series to the capacitance 220. The spacing 216 can be selected to obtain a desired value for the capacitance 222. FIG. 3 is a graph illustrating a capacitance ratio for an example electronic device as a function of n-well spacing 216 according to one embodiment of the disclosure. A graph 300 includes a line 302 showing a decrease in the capacitance ratio as a function of n-well spacing 216. The capacitance ratio is calculated as a ratio of the series capacitance of C1 and C2 with the poly-to-substrate capacitance of an identical device with no fully depleted region. A continuing increase in the spacing 216 results in a continuing and proportional decrease of the capacitance ratio. Thus, representing that the formation of the fully depleted region results in a decrease of the parasitic capacitance.

Figure 4:
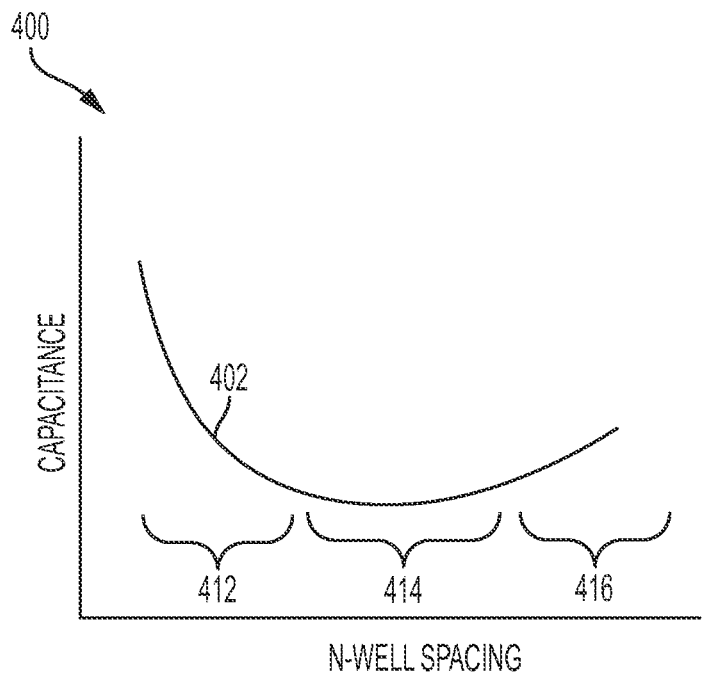
FIG. 4 is an example graph illustrating a capacitance ratio for an example electronic device as a function of a large range of n-well spacings according to one embodiment of the disclosure.

Although the data in the graph 300 of FIG. 3 shows a linear trend, the capacitance ratio is nonlinear at extreme values of the spacing 216. FIG. 4 is a graph illustrating a capacitance ratio for an example electronic device as a function of a large range of n-well spacings according to one embodiment of the disclosure. A graph 400 includes line 402 showing a rapid decrease in the capacitance as a function of n-well spacing 216 in a first range 412, a smaller change in capacitance in a second range 414, and an increase in the capacitance as a function of n-well spacing 216 in a third range 416. If the n-well doped regions are too close together or touching as in region 412 or too far apart as in region 416, then the capacitance added in series to reduce parasitic capacitance is either reduced or eliminated. In certain embodiments, an example n-well spacing 216 may be less than approximately 3 microns.

If there is no or too little spacing 216, as in the range 412 of FIG. 4, then the parasitic capacitance that exists between the poly-layer and the substrate layer is relatively high. As the space between the two n-well doped regions is widened, the parasitic capacitance decreases and continues to decrease until an optimal reduction point is reached, such as in the region 414 of FIG. 4. If the space between the two n-well doped regions gets too wide, then the parasitic capacitance that exists between the poly-layer and substrate region begins to increase again as in region 416 of FIG. 4. Thus, there is an optimal space between the two N-well regions that is desired to be maintained so that parasitic capacitance is minimized between the poly-layer and the substrate layer. This optimal spacing can be a function of the dopant, levels of doping, thicknesses of layers, and other factors. One optimal spacing may result in a continuous depletion region between the two doped regions 204A and 204B.

Figure 5:
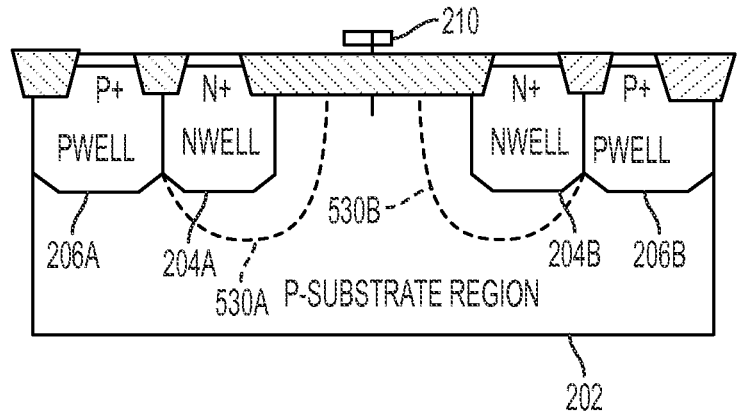
FIG. 5 shows an example cross-section of a semiconductor substrate with n-well doped regions spaced too far apart according to one embodiment of the disclosure.

When the spacing between n-well doped regions is too large, the depleted region becomes discontinuous, such as in the region 416 of FIG. 4. FIG. 5 shows an example cross-section of a semiconductor substrate with n-well doped regions spaced too far apart according to one embodiment of the disclosure. When the n-well doped regions 204A and 204B are too far apart, depletion regions 530A and 530B do not merge together and thus do not provide the additional capacitance to reduce the total parasitic capacitance. That is, the additional capacitance C2 220 shown for the system of FIG. 2 is not created, and thus there is little to no reduction in parasitic capacitance for the device 210.

Figure 6:
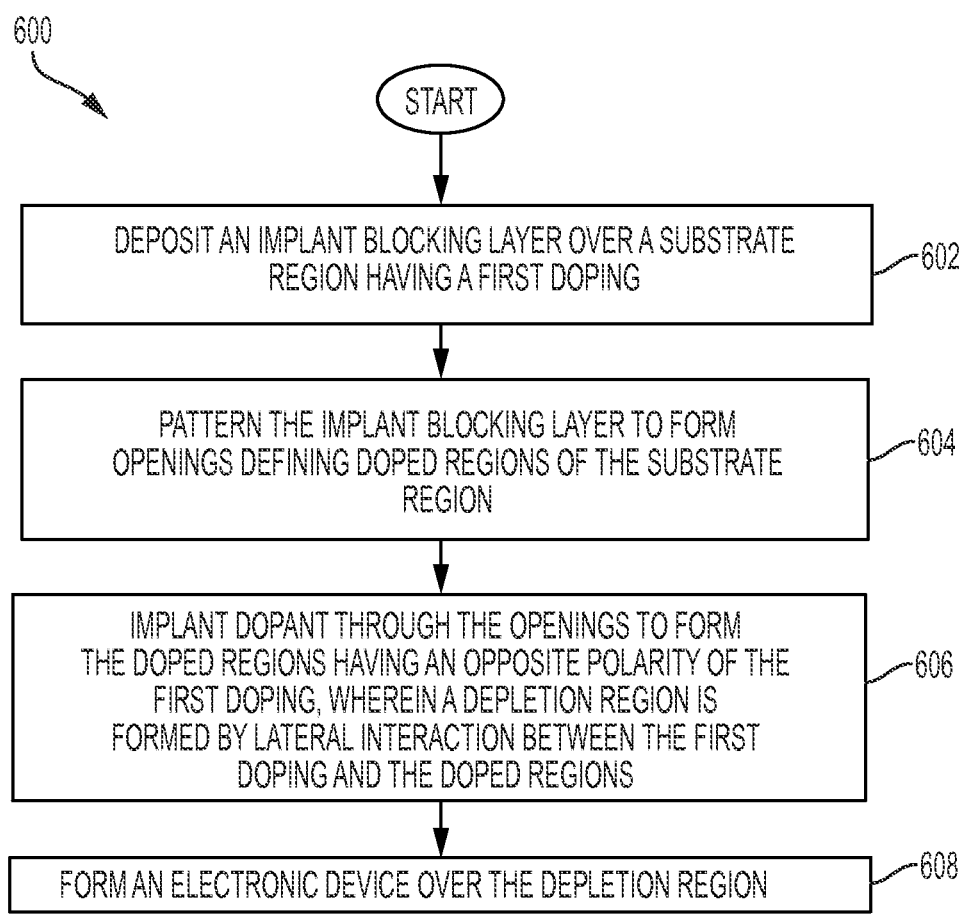
FIG. 6 is an example flow chart for manufacturing poly-silicon devices with reduced parasitic capacitance to a substrate region according to one embodiment of the disclosure.
Figure 7A:
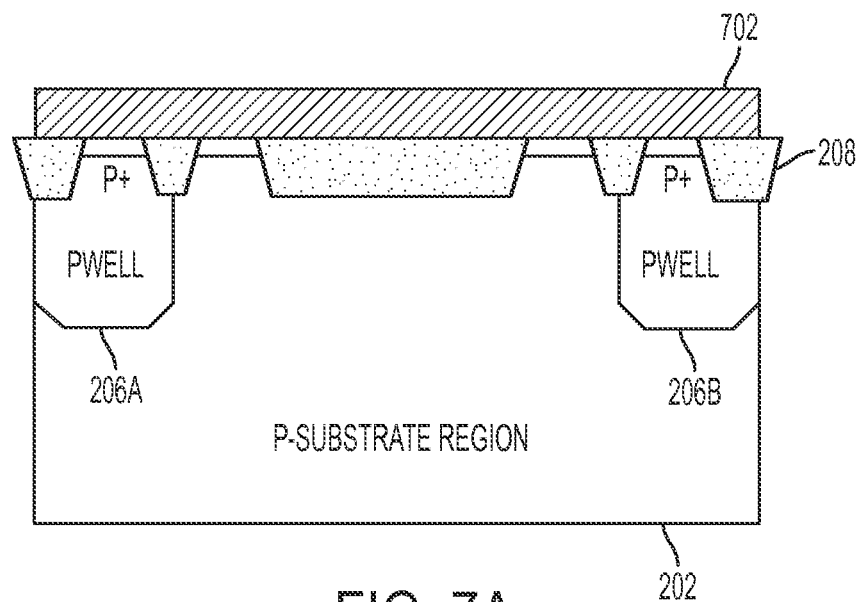
FIG. 7A is an example cross-section of a semiconductor device during manufacturing after deposition of an implant blocking layer according to one embodiment of the disclosure.

One method for manufacturing systems with the fully depleted region and reduced parasitic capacitance is described with reference to FIG. 6. The manufacturing process may include implanting dopant in a substrate region using a sacrificial implant blocking layer as a mask to form the doped regions. FIG. 6 is an example flow chart for manufacturing poly-silicon devices with reduced parasitic capacitance to a substrate region according to one embodiment of the disclosure. A method 600 begins at block 602 with depositing an implant blocking layer over a substrate region having a first doping. A cross-section of a semiconductor after block 602 is shown in FIG. 7A. The substrate region 202 may have p-well doped regions 206A and 206B and dielectric layer 208. An implant blocking layer 702 may be deposited over the substrate region 202.

Figure 7B:
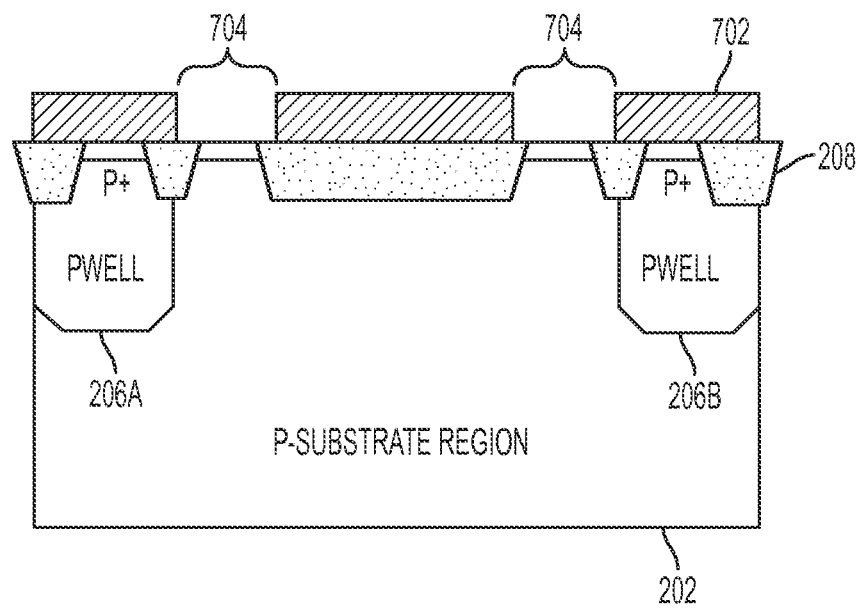
FIG. 7B is an example cross-section of a semiconductor device during manufacturing after forming openings in the implant blocking layer according to one embodiment of the disclosure.

At block 604, the implant blocking layer may be patterned to form openings defining doped regions of the substrate region. A cross-section of a semiconductor after block 604 is shown in FIG. 7B. Openings 704 may be formed in the implant blocking layer 702 in areas corresponding to desired areas for doped regions between which a depletion region will form. For example, spacing between the openings 704 may correspond to an optimal spacing described above with reference to FIG. 4. The openings 704 may be formed by well-known lithography techniques. For example, a sacrificial photoresist layer may be deposited on the implant blocking layer 702. The photoresist layer may then be patterned and used as an etch mask for etching the openings 704 in the implant blocking layer 702. Alternatively, the implant blocking layer 702 and the photoresist layer may be the same layer, such that the photoresist layer is patterned and used as the implant blocking layer 702.

Figure 7C:
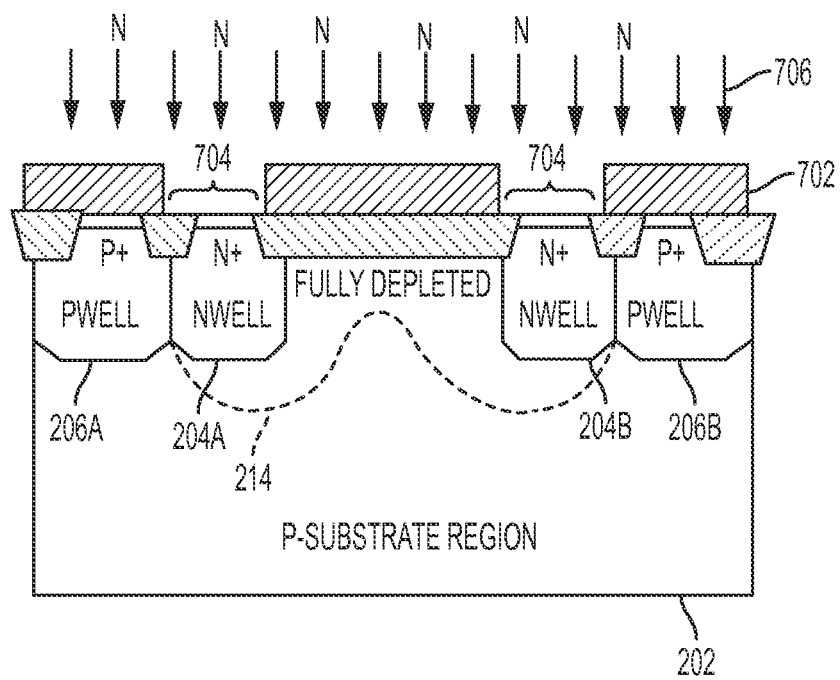
FIG. 7C is an example cross-section of a semiconductor device during manufacturing after implanting dopant through openings in the implant blocking layer according to one embodiment of the disclosure.

At block 606, dopant may be implanted through the openings to form the doped regions having an opposite polarity of the first doping. A cross-section of a semiconductor after block 606 is shown in FIG. 7C. The openings 704 in the implant blocking layer 702 may prohibit dopants 706 from entering the substrate region 202 in areas other than those defined by the openings 704 created in block 604. Lateral interaction between the dopants in the substrate region 202 and the dopants implanted at block 606 may form a depletion region 214 within the substrate region 202.

Figure 7D:
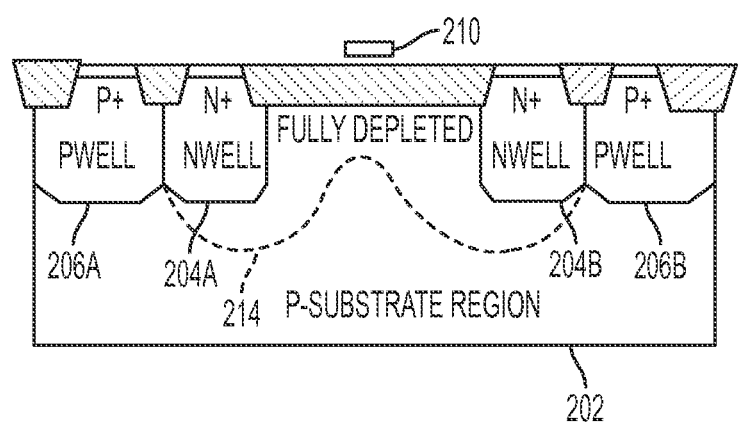
FIG. 7D is an example cross-section of a semiconductor device during manufacturing after forming an electronic device at least partially over a fully depleted region according to one embodiment of the disclosure.

Finally, at block 608, an electronic device may be formed over the depletion region formed at block 606. A cross-section of a semiconductor after block 608 is shown in FIG. 7D with electronic device 210 over insulating layer 208 and depletion region 214. By forming the depletion region below the electronic device of block 608, the electronic device may experience a reduced parasitic capacitance. The electronic device may be any component or portion of a component that includes a poly-silicon layer or other conductive layer. The reduced parasitic capacitance experienced by the electronic device is particularly suitable for high impedance devices, such as poly-resistors, poly-diodes, microelectromechanical systems (MEMS), and other devices that include a poly-silicon layer or other conducting layer over the silicon substrate. In a MEMS microphone device, a poly-silicon layer may be incorporated as part of the diaphragm for the microphone. The use of the fully depleted region beneath the poly-silicon diaphragm of the MEMS microphone reduces parasitic capacitance and thus improves performance of the MEMS microphone. Although the implementation of the fully depleted region beneath the electronic devices may result in a slight decrease in achievable density of the electronic devices, high impedance devices such as those described above are generally not manufactured at extremely high densities such as, for example, densities used in transistor arrays for digital memory.

Figure 8:
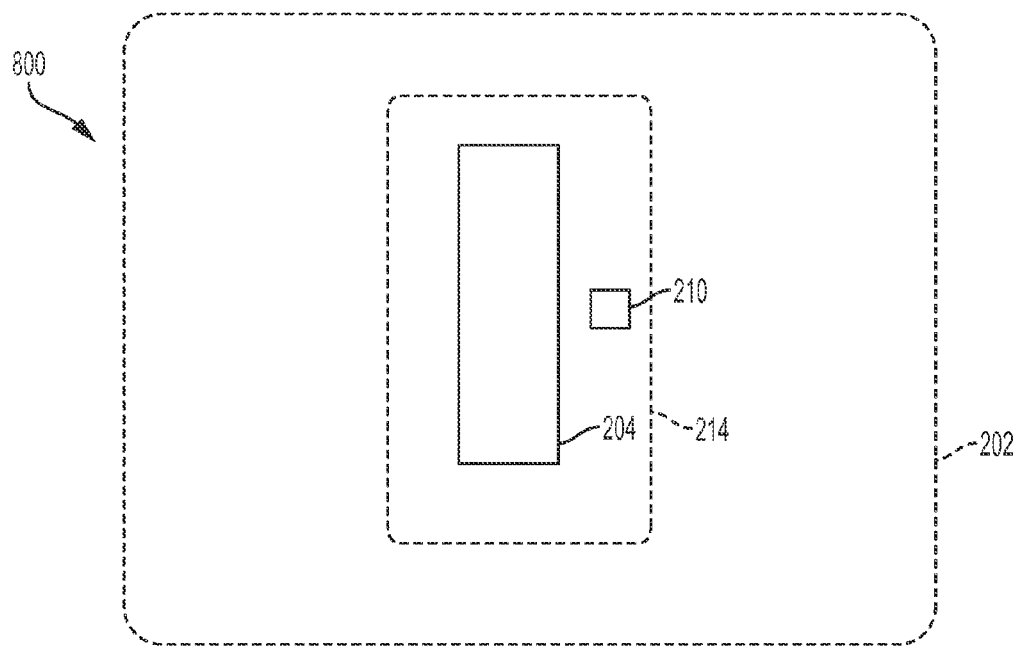
FIG. 8 is an example top-down view of a system with a fully depleted region formed by a single doped region according to one embodiment of the disclosure.

In the examples described above, a fully depleted region in a substrate region is formed and that fully depleted region implemented under a device to reduce parasitic capacitance. Each of the examples describes the formation of the fully depleted region by the formation of two n-well doped regions. However, the fully depleted region may be created through lateral interaction of dopants from the substrate region to other structures formed in the substrate region. For example, a single n-well doped region may be used to form a fully depleted region. FIG. 8 is an example top-down view of a system with a fully depleted region formed by a single doped region according to one embodiment of the disclosure. A system 800 may include a single doped region 204 formed near the electronic device 210. A fully depleted region 214 may be formed by lateral interaction of dopant in the doped region 204 with dopant in the substrate region 202. The doped region 204 may be formed by the same process described above with reference to FIG. 6 by defining openings at block 604 to form openings corresponding to the single doped region 204 of FIG. 8. Other manufacturing processes for forming the single doped region 204 are also available.

Figure 9:
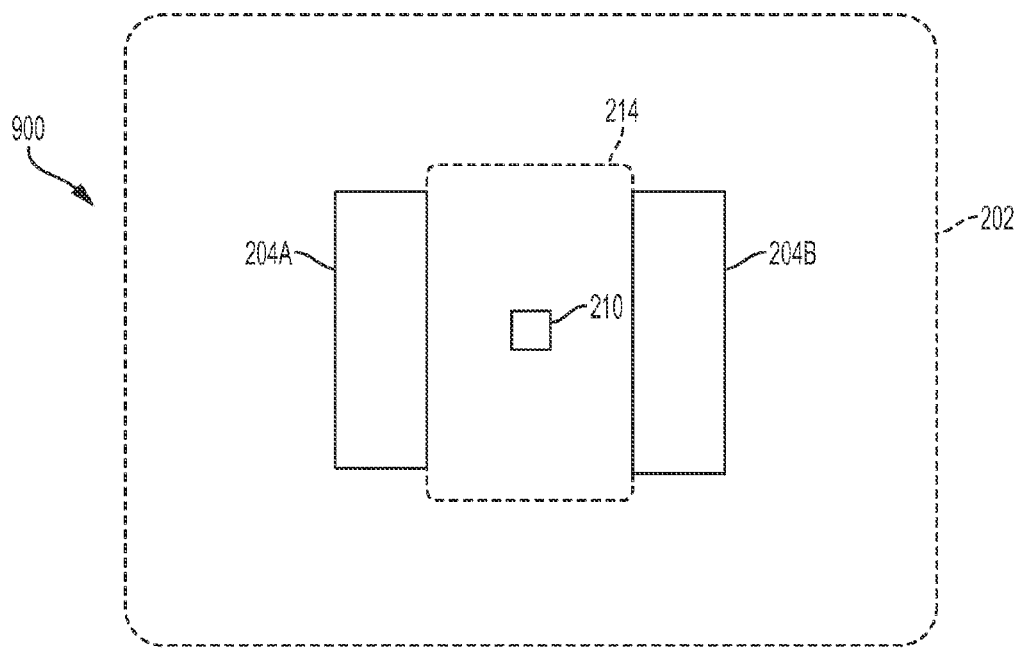
FIG. 9 is an example top-down view of a system with a fully depleted region formed by two doped regions around an electronic device according to one embodiment of the disclosure.

Another structure formation for forming a fully depleted region is shown in FIG. 9. FIG. 9 is an example top-down view of a system with a fully depleted region formed by two doped regions around an electronic device according to one embodiment of the disclosure. A system 900 may include two doped regions 204A and 204B formed near the electronic device 210. A fully depleted region 214 may be formed by lateral interaction of dopant in doped regions 204A and 204B with dopant in the substrate region 202. The doped regions 204A and 204B need not be mirror images of each other, but may vary in shape and size. The doped regions 204A and 204B may be formed by the same process described above with reference to FIG. 6 by defining openings at block 604 to form openings corresponding to the doped regions 204A and 204B of FIG. 9. Other manufacturing processes for forming the single doped region 204 are also available.

Figure 10:
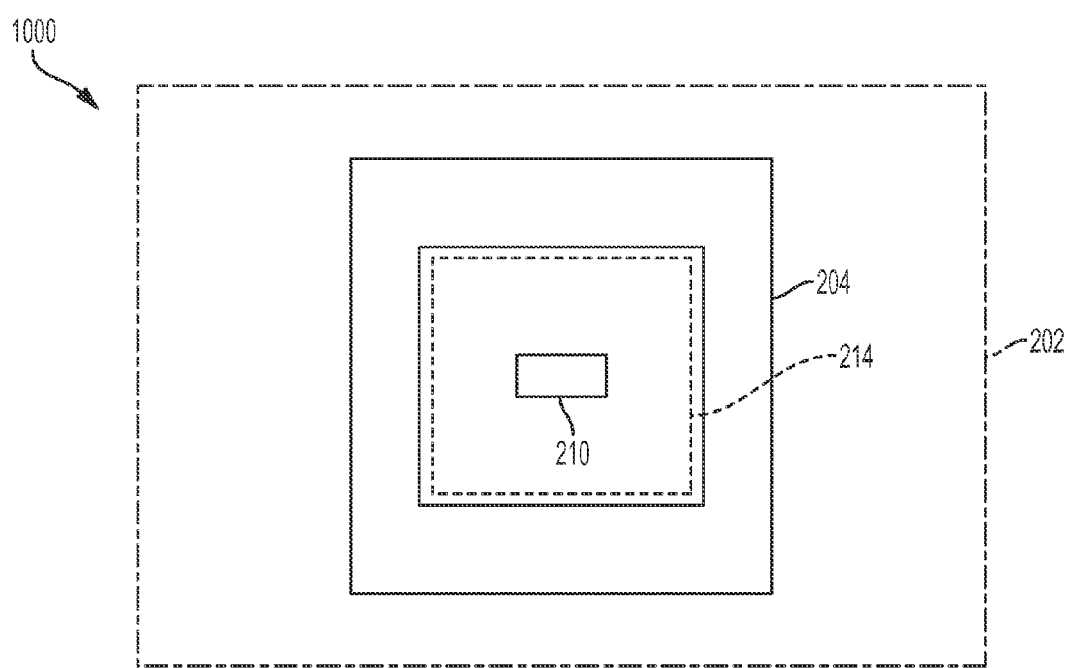
FIG. 10 is an example top-down view of a system with a fully depleted region formed by an annular doped region around an electronic device according to one embodiment of the disclosure.

Yet another structure formation for forming a fully depleted region is shown in FIG. 10. FIG. 10 is an example top-down view of a system with a fully depleted region formed by an annular doped region around an electronic device according to one embodiment of the disclosure. A system 1000 may include a doped region 204 formed near and around the electronic device 210. A fully depleted region 214 may be formed by lateral interaction of dopant in doped region 204 with dopant in the substrate region 202. The doped region 204 need not form a complete enclosure, but may have breaks in the doped region 204. Further, the doped region 204 may take shapes other than a square, such as a circle, oval, triangle, quadrilateral, or an irregular shape. The doped region 204 may be formed by the same process described above with reference to FIG. 6 by defining openings at block 604 to form openings corresponding to the doped region 204 of FIG. 10. Other manufacturing processes for forming the doped region 204 are also available.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although a p-doped substrate region and n-doped doped regions are described throughout the specification, devices may be manufactured with an n-doped substrate region and p-doped doped regions. Further, devices may be manufactured with both arrangements, such as in complementary metal-oxide-semiconductor (CMOS) systems. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a substrate region having a first doping;
a dielectric layer on the substrate region;
a doped region in the substrate region, wherein the doped region has a second doping that is an opposite polarity dopant from the first doping of the substrate region, wherein the doped region comprises a first doped region and a second doped region;
a depletion region in the substrate region formed by lateral interaction between the second doping of the doped region and the first doping of the substrate region resulting from a spacing between the first doped region and the second doped region in the absence of an applied voltage to the doped region and the substrate region, wherein the depletion region is a continuous depletion region extending between the first doped region and the second doped region; and
an electronic device on the dielectric layer and at least partially over the depletion region such that a parasitic capacitance between the electronic device and the substrate region is reduced.

2. The apparatus of claim 1, wherein the first doped region and the second doped regions are on opposite sides of the electronic device.

3. The apparatus of claim 2, wherein the first doped region and the second doped region comprise wells, wherein the second doping is n-doped, and wherein the first doping is p-doped.

4. The apparatus of claim 1, wherein the doped region comprises an annulus made from the first doped region and the second doped region, and wherein the depletion region comprises a portion of a region defined within the annulus.

5. The apparatus of claim 1, wherein the electronic device comprises a poly-silicon layer.

6. The apparatus of claim 1, wherein the electronic device comprises a microelectromechanical system (MEMS) microphone.

7. The apparatus of claim 6, wherein the depletion region is configured to reduce capacitance between the MEMS microphone and a ground.

8. The apparatus of claim 1, further comprising a power supply coupled to the doped region and configured to bias the doped region.

9. A method, comprising:
depositing an implant blocking layer over a substrate region having a first doping;
patterning the implant blocking layer to form openings defining doped regions of the substrate region;
implanting dopant through the openings in the implant blocking layer to form doped regions in the substrate region, wherein the dopant is of a second doping and is an opposite polarity from that of the first doping, and wherein the step of implanting the dopant forms a depletion region in at least a portion of the substrate region by lateral interaction between dopant of the second doping in the doped regions and dopant of the first doping in the substrate region, wherein the step of implanting the dopant results in formation of the depletion region as a continuous depletion region extending from a first doped region of the doped regions to a second doped region of the doped regions in the absence of an applied voltage to the doped region and the substrate region; and
forming an electronic device at least partially over the depletion region such that a parasitic capacitance between the electronic device and the substrate region is reduced.

10. The method of claim 9, wherein the step of patterning the implant blocking layer comprises forming at least one opening to form a doped region on a side of the electronic device.

11. The method of claim 9, wherein the step of patterning the implant blocking layer comprises forming a first opening for the first doped region and a second opening for the second doped region, wherein the first doped region and the second doped regions are on opposite sides of the electronic device.

12. The method of claim 9, wherein the step of patterning the implant blocking layer comprises forming an annular opening, and wherein the depletion region comprises a portion of a region defined within the annulus.

13. The method of claim 9, wherein the step of forming the electronic device comprises forming a poly-silicon based device.

14. The method of claim 13, wherein the step of forming the poly-silicon based device comprises a microelectromechanical system (MEMS) microphone.

15. The method of claim 9, wherein the step of implanting the dopant comprises implanting an n-type dopant in a p-type doped substrate region.

16. The method of claim 9, wherein depositing the implant blocking layer comprises depositing a sacrificial layer.

17. A microelectromechanical system (MEMS) microphone system, comprising:
 a substrate region having a first doping;
 a dielectric layer on the substrate region;
 a doped region in the substrate region, wherein the doped region has a second doping that has an opposite polarity from that of the first doping of the substrate region, wherein the doped region comprises a first doped region and a second doped region;
 a depletion region in the substrate region formed by lateral interaction between the second doping of the doped region and the first doping of the substrate region resulting from a spacing between the first doped region and the second doped region in the absence of an applied voltage to the doped region and the substrate region, wherein the depletion region is a continuous depletion region extending between the first doped region and the second doped region; and
 a polysilicon-based diaphragm on the dielectric layer and at least partially over the depletion region such that a parasitic capacitance between the polysilicon-based diaphragm and the substrate region is reduced.

18. The apparatus of claim 17, further comprising a power supply coupled to the doped region and configured to bias the doped region.

* * * * *